United States Patent [19]
Hunt

[11] Patent Number: 5,528,066
[45] Date of Patent: Jun. 18, 1996

[54] BIPOLAR TRANSISTOR HAVING A COLLECTOR WELL WITH A PARTICULAR CONCENTRATION

[75] Inventor: Peter C. Hunt, Northampton, England

[73] Assignee: Phoenix VLSI Consultants Limited, Towcester, United Kingdom

[21] Appl. No.: 321,158

[22] Filed: Oct. 11, 1994

Related U.S. Application Data

[63] Continuation of Ser. No. 42,636, Apr. 5, 1993, abandoned.

[30] Foreign Application Priority Data

Apr. 6, 1992 [GB] United Kingdom .................. 9207472

[51] Int. Cl.$^6$ .......................... H01L 29/76; H01L 29/94; H01L 27/082
[52] U.S. Cl. .......................... 257/378; 257/370; 257/588
[58] Field of Search .................................. 257/587, 588, 257/592, 593, 370, 377, 371, 611, 378

[56] References Cited

U.S. PATENT DOCUMENTS

| | | | |
|---|---|---|---|
| 3,723,199 | 3/1973 | Vora ........................................ | 257/593 |
| 4,573,256 | 3/1986 | Lechaton et al. ....................... | 257/593 |
| 4,949,145 | 8/1990 | Yano et al. ............................. | 257/592 |
| 4,966,865 | 10/1990 | Welch et al. ........................... | 257/588 |
| 5,109,262 | 4/1992 | Kadota et al. ......................... | 257/587 |
| 5,245,209 | 9/1993 | Ishigaki .................................. | 257/370 |
| 5,358,883 | 10/1994 | Burger et al. .......................... | 257/557 |

*Primary Examiner*—Wael M. Fahmy
*Attorney, Agent, or Firm*—Watson Cole Stevens Davis

[57] ABSTRACT

A bipolar transistor module which can be implemented into existing CMOS processes without the use of buried layers of epitaxy is described. The transistor makes use of a synthesis of new ideas to achieve high performance. Extended polysilicon electrodes (2,4,6) are utilised to reduce device dimensions and a compatible well is described which maintains a p-channel MOS transistor electrical characteristics whilst lowering the collector series resistance.

9 Claims, 9 Drawing Sheets

BIPOLAR TRANSISTOR HAVING A COLLECTOR WELL WITH A PARTICULAR CONCENTRATION

This application is a File Wrapper Continuation application of application Ser. No. 08/042,636, filed Apr. 5, 1993, now abandoned.

FIELD OF THE INVENTION

This invention relates to bipolar transistors and in particular bipolar transistors which can be integrated with CMOS technology.

The field of silicon integrated circuits has, since the birth of the technology during the late 1950s, aimed to integrate more and more logic functions within smaller areas of silicon to meet the ever growing performance needs presented by modern electronic systems. There are, traditionally, two different transistor structures which have been used in mainstream technologies, bipolar transistors and metal oxide silicon (MOS) field effect transistors. Bipolar transistors have high switching speeds arising from small active dimensions and low capacitances, however, the operational currents and the power dissipated are high and hence the number of transistors that can be integrated per chip is low. MOS transistors are incorporated to great effect in the, so-called, Complementary MOS (CMOS) technology which has exceptionally low power dissipation and small device size and hence can be integrated to very high levels, however, the switching speeds of these transistors is much lower than bipolar. As a comparison, modern bipolar processes can achieve integration levels of about 50,000 logic gates per chip but can function at clock speeds over 1 GHz whilst CMOS processes can achieve well over 250,000 logic gates (over 1 million transistors) but can only function at clock speeds of up to 150 MHz. The emerging requirements of modern high performance systems are demanding a combination of both high switching speed and high logic density on the same chip, this requirement has led to the development of the hybrid technology called BiCMOS which integrates bipolar and CMOS transistors on the same chip. Current approaches to BiCMOS technology have involved the addition of many extra masking layers and, in general, the use of buried layers and epitaxy which all add on to the existing CMOS process flow. For this reason, BiCMOS processes have traditionally been more expensive to implement and to run, and this has discouraged the widespread acceptance of these technologies.

Thus, it would be advantageous to provide a method of making a high performance bipolar transistor which could be carried out using available CMOS technology, without the need for additional equipment needed to form buried epitaxial layers, for example, whilst achieving all of the advantages of currently available bipolar devices.

Several factors contribute to the switching speed of the bipolar transistor, in particular the underlying resistances and capacitances. The use of buried epitaxial layers in existing BiCMOS technology is an attempt to minimize these underlying resistances, such as the collector-emitter resistance and the collector-base resistance. Clearly, the distances between the collector and base or the collector and emitter contribute to the overall resistances.

Traditionally, contacts to the collector, emitter and base of a bipolar transistor have been made from metal. Contacting the collector, emitter and base with metal involves several process steps each of which increases the minimum spacing between the collector emitter and base.

SUMMARY OF THE INVENTION

According to the present invention, a bipolar transistor is formed in a well defined in a substrate, in which at least one of the collector, emitter and base has an electrode formed directly on its surface, each electrode preferably extending beyond its associated transistor region.

The formation of the transistor in a well, can be carried out using conventional CMOS processes. The use of polysilicon electrodes is known per se but as far as the present inventor is aware they have not hitherto been applied in this way.

The "extension" of the or each electrode enables contact to a conductor, such as metal, to be provided outside the transistor active area.

Another preferred feature of the invention which contributes to the reduction of the underlying resistances is an enhanced well structure for the collector. The well is made deeper than the usual CMOS well, e.g. in the range 2–5 μm, preferably 3.5 μm, whilst maintaining the usual surface dopant concentration and overall profile. It is believed that any well depth greater than 3.5 μm would be satisfactory to achieve the object of the invention. The well formation can be very simply integrated into an existing CMOS process by allowing other CMOS devices on the same substrate to have the same well profile. Obviously, performance of such devices would not be harmed. Thus, the well is preferably formed by the steps of ion implantation, followed by diffusion to achieve the desired well depth.

The invention provides a novel bipolar transistor and method of manufacture as well as a novel integrated circuit and method for its manufacture including the bipolar transistor of the invention.

According to the invention, full advantage can be taken of device scaling principles which, when considered alongside the polysilicon electrodes and the modified N-Well, remove the necessity for an epitaxial collector structure to achieve an acceptably low collector series resistance. As device sizes and operating currents are reduced the influence of the collector series resistance on the device performance is decreased.

The invention provides a method of manufacture of a bipolar transistor including the special features outlined above, and explained in detail below, which can form part of an existing CMOS process and provide a high performance BiCMOS process. The invention utilises many of the layers commonly found within a standard CMOS process to fabricate an embedded bipolar transistor which achieves high performance without the use of the buried collector layers and epitaxial silicon growth commonly used in existing BiCMOS processes.

BRIEF DESCRIPTION OF THE DRAWINGS

Certain embodiments of the invention will now be described by way of example only and with reference to the accompanying drawings in which.

DETAILED DESCRIPTION OF THE PREFERRED EMBODIMENTS

Figure 1:
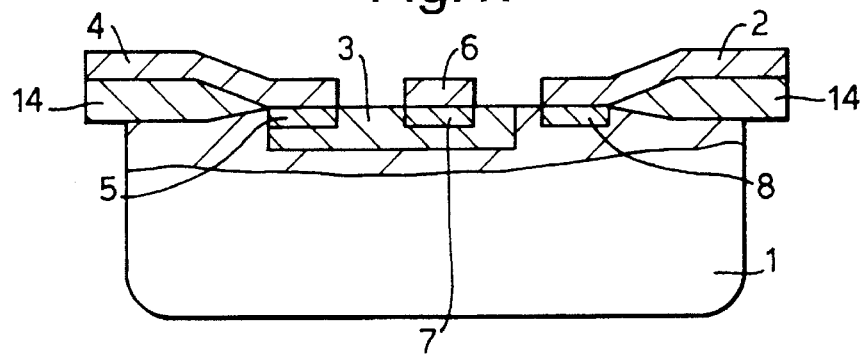
FIG. 1 shows, in schematic cross-section, a bipolar transistor according to the present invention.

Referring to the drawings, the bipolar transistor shown in FIG. 1 comprises an n-type collector region 1 which comprises the modified CMOS N-Well described below. Contact to the collector region is accomplished by the collector polysilicon electrode 2 and an $N^+$ diffusion 8 which has been driven out of the polysilicon. A shallow p-type base region 3 is provided and this is contacted by the base polysilicon electrode 4, an ohmic contact is provided by a $P^+$ region 5 formed by dopant diffused out of the base polysilicon. The emitter junction is provided by a polysilicon electrode 6 out of which the emitter $N^+$ dopant 7 has been driven. In contrast to metal electrodes, the three polysilicon extended electrodes (base, collector and emitter) can be defined at minimum geometry significantly reducing the overall device area and lowering all associated resistances and capacitances. Electrical contact to the device is achieved by making metallurgical contacts to the extended polysilicon electrodes where they run onto the device isolation region 14, the device size is consequently not influenced by the metal track separation and is defined purely by the polysilicon electrode separation. The metallurgical contacts are shown in FIG. 2, identified by numerals 16,18,20. The metallurgical contacts are typically adhered to the polysilicon electrodes by glass contacts 15,17 and 19, shown in FIG. 2.

Figure 2:
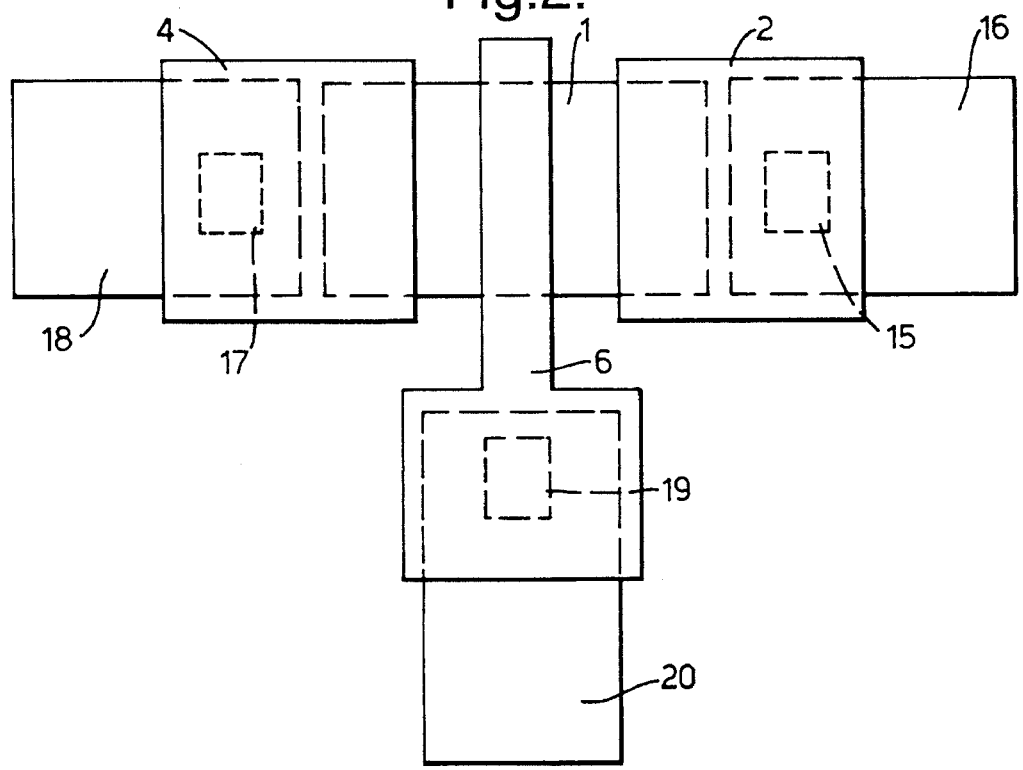
FIG. 2 is a plan view of the transistor of FIG. 1.
Figure 3:
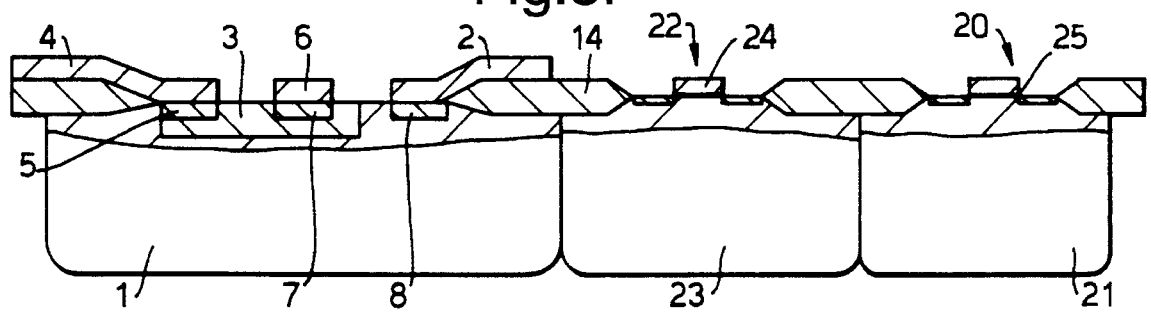
FIG. 3 shows the bipolar device of FIGS. 1 and 2 integrated into a typical CMOS structure.

FIG. 3 shows the bipolar device of FIGS. 1 and 2 integrated into an existing p-type substrate CMOS structure. The structure includes a p-channel MOS transistor indicated generally at 20 having an N-Well 21 similar to the N-Well 1 of the bipolar transistor of FIG. 1, and an n-channel MOS device 22 having a CMOS P-Well 23. The polysilicon electrodes 2,4,6 are shown to be the same material as the MOS gate conductor 24. The gate oxide 25 required for the formation of the insulating gate structure of the MOS transistor has been etched away in the bipolar device according to this invention so that the polysilicon electrodes 2,4,6 contact the silicon directly in the bipolar transistor region.

The polysilicon electrode and the base region dopings can be achieved by utilising some of the same implants as used in the CMOS process, however, separate implants may be required for some of these stages if the implant conditions are non-optimal; this is particularly true for the emitter implant as this is a critical stage.

Figure 4:
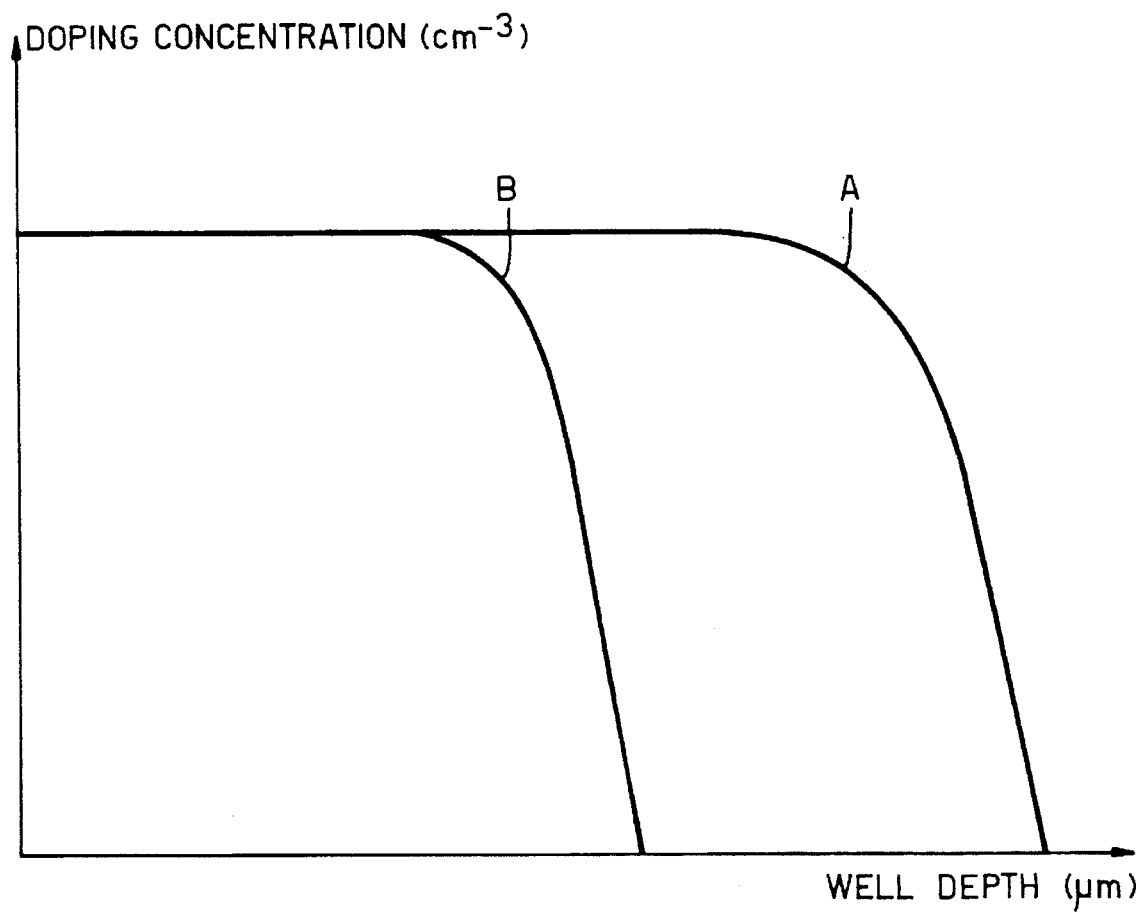
FIG. 4 is a graph of doping concentration versus depth for the CMOS well of the device of FIGS. 1 to 3, as compared to a standard CMOS well.

FIG. 4 shows the modified well structure used in the present invention. The doping concentration is represented on a logarithmic scale. The N-Well region provides both the collector (1) diffusion for the bipolar transistor and the local substrate for the p-channel MOS transistor 20. An optimisation of the N-Well formation process is therefore required to achieve the highest performance of the bipolar device and to maintain the existing electrical characteristics of the p-channel MOS transistor. This is achieved by designing the modified N-Well (curve A) to have the same surface concentration and surface profile as the standard MOS N-Well (curve B). The electrical characteristics of the MOS transistor will remain the same since the doping levels remain the same in the vicinity of the device active regions. The modified N-well is deeper than the standard well and therefore has a lower resistance and, since this well forms the collector of the bipolar device, optimization of the well depth will allow device performance to be maximised. As an example, and purely for illustration purposes, standard MOS N-Wells would lave depths of around 2 μm and surface concentrations around $5E16$ $cm^{-3}$ whilst a modified well would have a depth nearer 3.5 μm with the same surface concentration and profile. The deeper well is achieved by modifying the ion implant dose and subsequent diffusion to provide the desired characteristic. In general, the surface concentration may be anything between $3\times10^{16}$ and $1.5\times10^{17}$ $cm^{-3}$. The well (30) forming the collector has a substantially uniform dopant concentration from its surface to at least 50% of its depth.

An exemplary method according to the invention will now be described with reference to FIGS. 5 to 19. It will be appreciated that the steps in the process described below can be performed in various orders and the following is merely one possible working method.

The steps required to achieve the structure are briefly explained below and listed in Table 1, also below.

Figure 5:
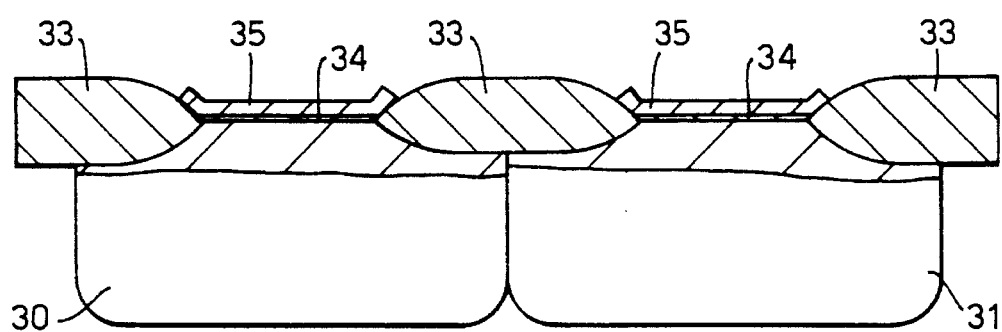
FIGS. 5 to 21 illustrate various stages in the manufacture of a CMOS structure including a bipolar transistor according to the invention.

A p-type substrate is first selected (step 1) and its surface is oxidised (step 2) to a thickness of 500 A (50 nm). The whole of the Substrate wafer then undergoes a p-type implantation (step 3). The substrate surface is then masked at print step 4 and the remaining exposed area, defining the CMOS N-Well 30 undergoes n-type implantation (step 5). In other words part of the p-type material defined in step 3 is "over-doped" to make it n-type. The resist mask laid down at step 3 is removed at step 6. A "well drive" (step 7) is then carried out to drive implanted material deep into the substrate. During this step a layer of oxide 2100 A (210 nm) thick is grown. The oxide is then removed at step 8. A thinner layer of oxide is grown over the substrate surface at step 9. This is the layer indicated by numeral 34 in FIG. 5. A nitride layer 35 is deposited over the oxide (step 10) and a layer of photoresist is deposited (step 11) to mask the desired active areas (AA). Then, the nitride and oxide layers 34,35 are removed (etched) from all but the active areas (step 12) and the photoresist is then removed (step 13). At step 14 a mask is printed to "window" the P-Well 31 and it is then implanted p-type at step 15. The resist is then stripped at step 16. The whole substrate is then subject to a field oxidation step 17 in which the nitride layer 35 forms a barrier, whereby the isolation regions 33, described above in relation to FIGS. 1,2 and 3 are formed. The resulting structure is shown in FIG. 5.

TABLE 1

| PROCESS FLOW | |
|---|---|
| (1) Substrate Choice | P (8–12 Ohm-cm) Epi 12 μm <100> |
| (2) Oxidation | (500 A) |
| (3) P-Well implant | (Blanket; B, 60 KV, 6.5E12) |
| (4) Print N-Well | (Defines CMOS and Bipolar N-Wells) |
| (5) Implant N-Well | (P, 150 KV, 1.1E13) |
| (6) Resist Strip | (SP) |
| (7) Well Drive | (1000 C, 02, 2100 A, 1150 C, N2, 110 m) |
| (8) Oxide Dip | (HF Dewet) |
| (9) Pad Oxidation | (250 A) |
| (10) Nitride Deposition | (1500 A) |
| (11) Active Area Print | (Defines MOS and Bipolar AAs) |

TABLE 1-continued

PROCESS FLOW

(12) Plasma Etch AA
(13) Resist Strip (SP)
(14) Print P-Field (Opens window over P-Well)
(15) Implant P-Field (B, 23 KV, 7E13)
(16) Resist Strip
(17) Field Oxidation (1000 C, 225 min, 8500 A)

As noted above with reference to FIG. 4, it is particularly important in this embodiment of the invention that the CMOS N-Well should have certain characteristics, particularly in terms of depth and surface concentration of dopant. Thus, whilst the steps noted above are all standard CMOS technology, in the process according to the invention, particular care is taken in step 7, to achieve desired parameters, and all other steps which have an effect on the characteristics of the CMOS N-Well.

In the next processing step, any thin oxide which may have formed on the nitride 35 is removed in a solution of buffered hydrogen fluoride and the nitride is then removed.

The base will next be implanted through this pad oxide into the bipolar N-Well region 30. The dose and energy of the base implant will have to be carefully set as the base will experience a number of high temperature processing stages (notably doping with POCL3). Depth and surface concentration of the base region at the end of the process will be about 1E18 ($1\times10^{18}$) and 0.3 µm deep.

It should be noted here that whilst this process describes the formation of a CMOS n-channel transistor, the production of a CMOS p-channel transistor is possible according to the invention.

Figure 6:
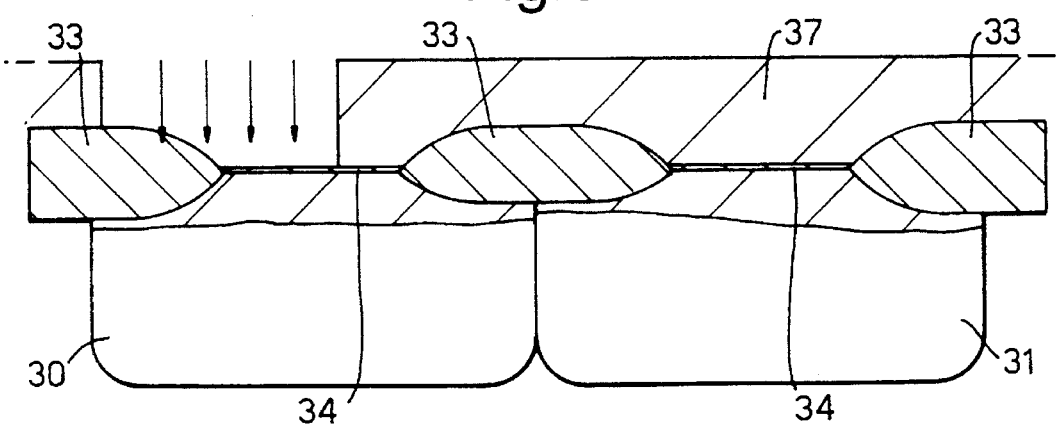

Next a printing step is used to define the base region of the bipolar transistor. FIG. 6 shows a layer of photoresist 37 marking all but the base region. The base region is then implanted. The field oxide or isolation 33 acts as a mask itself so that the position of the edge of the mask 37 on the left side of FIG. 6 is not critical.

Figure 7:
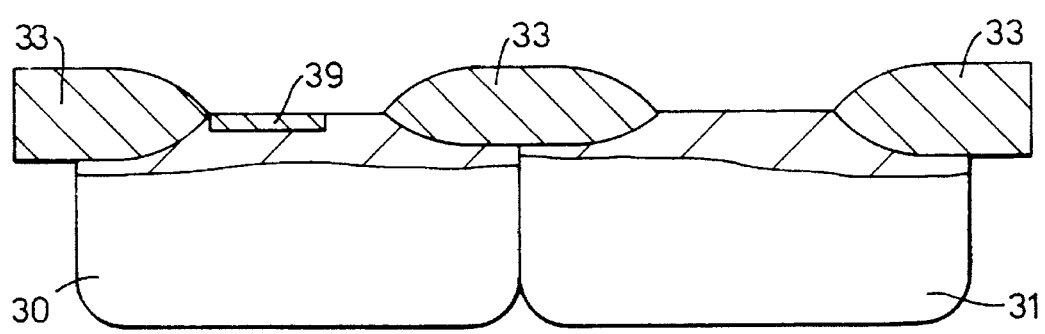

The resist is then removed, followed by the oxide 34, leaving the structure shown in FIG. 7 with the base region 39 formed.

Figure 8:
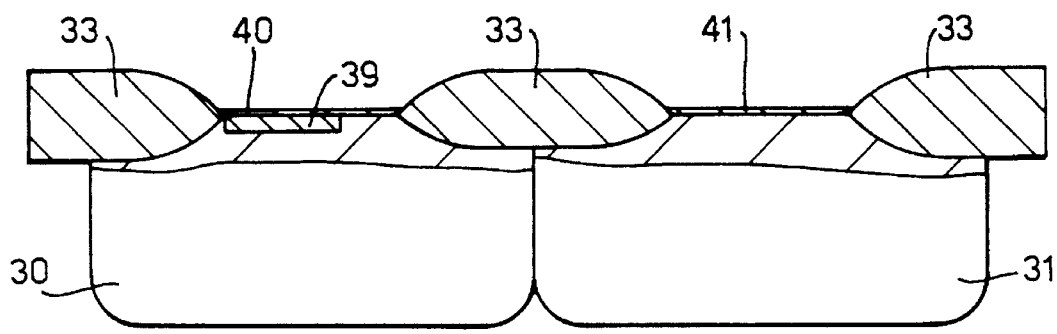

The structure of FIG. 7 is then subjected to a "pre-gate" oxidation step during which a layer of oxide 225 A (22.5 nm) thick is grown onto the surface at a temperature of 920° C. The structure is then dipped in buffered hydrogen fluoride to remove the oxide. The purpose of these two steps is to remove a thin region of silicon from the substrate surface which will have been damaged during the preceding stages. During dipping, the oxide of the isolation regions 33 is also reduced, typically to a depth of 6000 A (600 nm). A further oxidation step is next carried out to provide a thin layer of oxide over the now "good" silicon surface, typically 200 A (20 nm) thick, grown at 920° C. This oxide is indicated by numerals 40,41 in FIG. 8. In FIG. 8, a standard CMOS gate oxide region 41 has now been formed, with the bipolar N-Well 30 having a base implant 39.

The structure of FIG. 8 is subjected to a threshold voltage adjustment step, that is a doping stage using boron, using a voltage of 4 key and a dose of $1.4\times10^{12}$ ions per $cm^2$.

Figure 9:
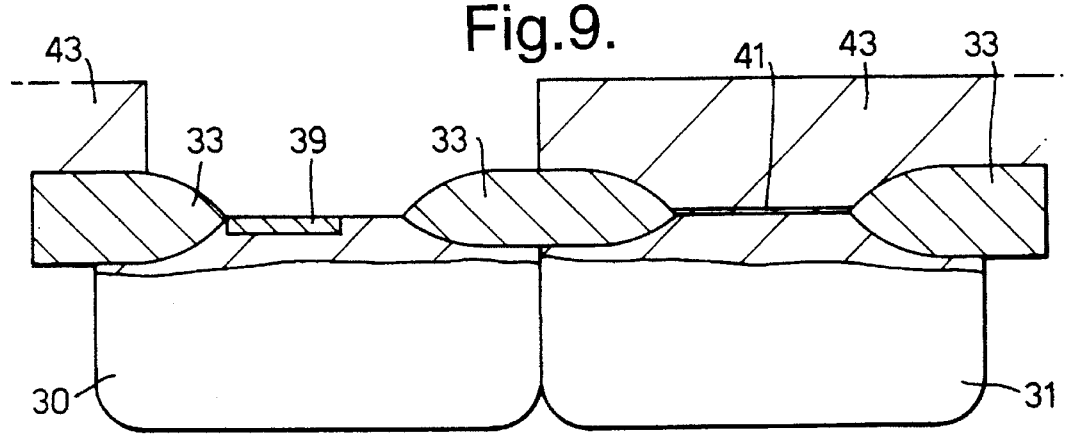
Figure 10:
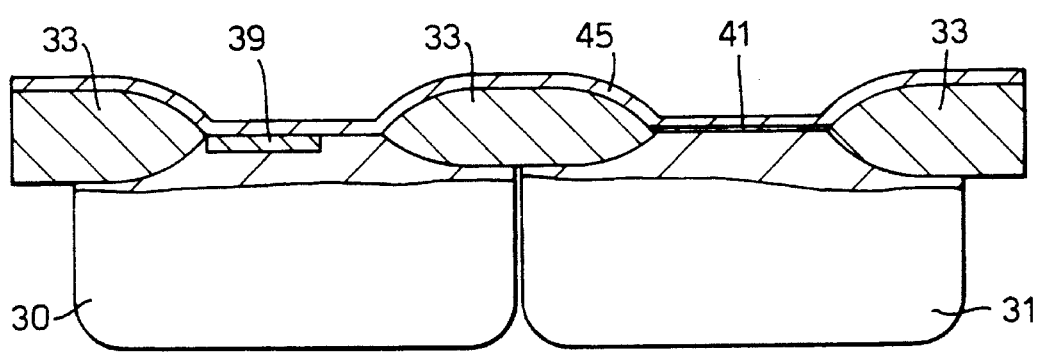

Next, a further printing step is carried out to define the bipolar active area, using a further mask of photoresist 43 as shown in FIG. 9. The oxide 40 is then removed from the bipolar active area. It will be noted that the oxide 41 is left intact over the P-Well 31. Following removal of the photoresist 43, a layer of polysilicon 45 350 nm thick is deposited over the entire substrate as shown in FIG. 10.

Figure 11:
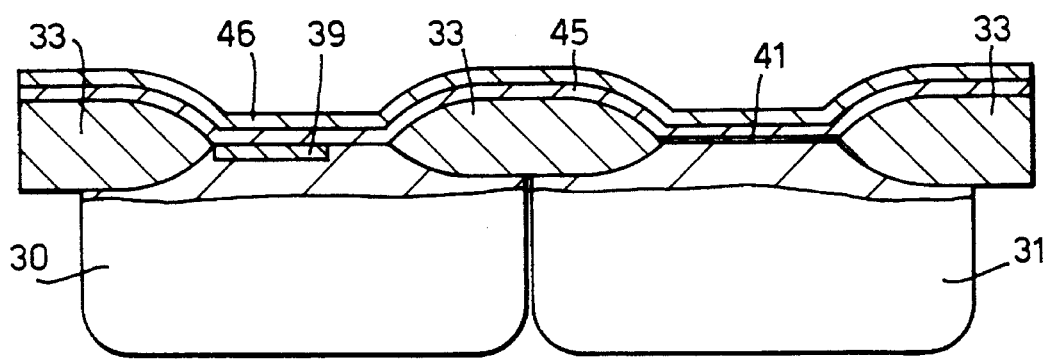
Figure 12:
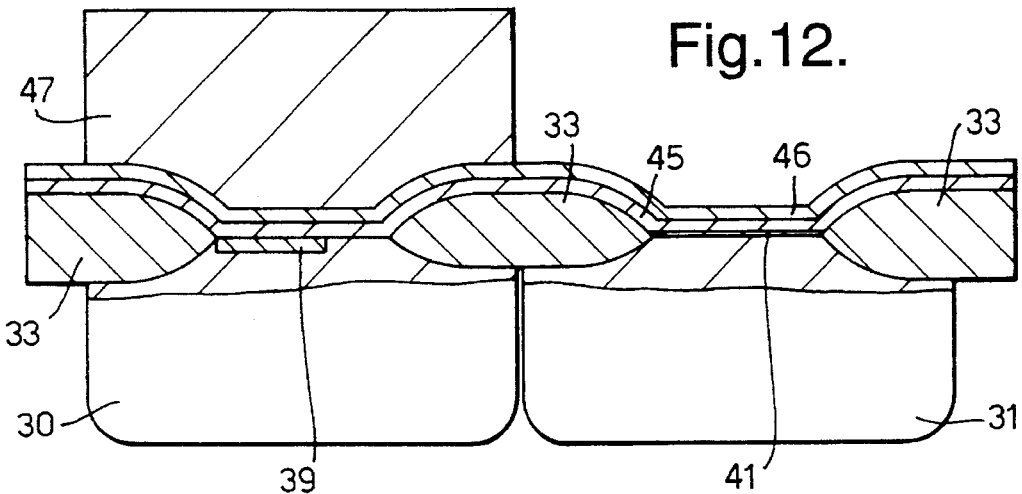
Figure 13:
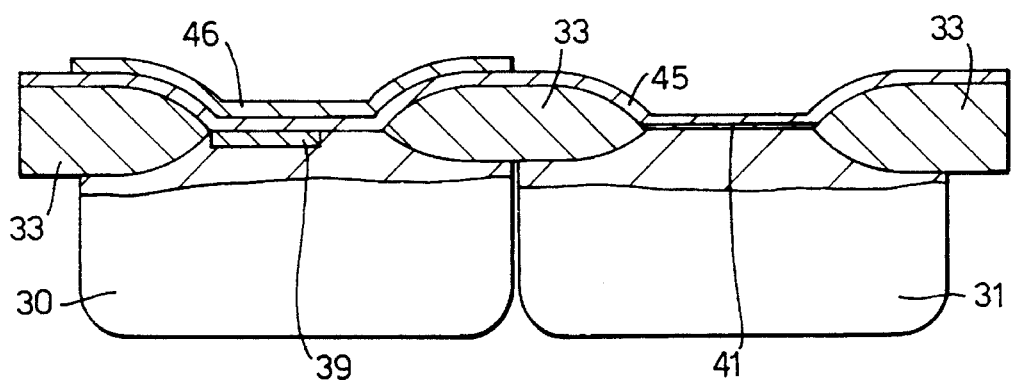

Referring now to FIG. 11, a so-called "low temperature oxide" 46 (because it is deposited rather than being grown) is deposited over the polysilicon 45, as shown in FIG. 11, a photoresist mask 47 is printed over the bipolar active area as shown in FIG. 12 and the oxide 46 is etched in the region outside the mask 47 followed by removal of the photoresist, to arrive at the structure shown in FIG. 13 in which an oxide layer remains over the bipolar active area.

Referring to FIG. 13, the exposed polysilicon is doped with POCL3. A deglazing step is then carried out to remove any residual POCL3 and the oxide mask 46. It will be appreciated that during this phase the mask 46 stops the POCL3 dopant from entering the bipolar region. Of course the POCL3 dopant step will sometimes not be required in which case the steps of FIG. 11,12 and 13 can be omitted.

Figure 14:
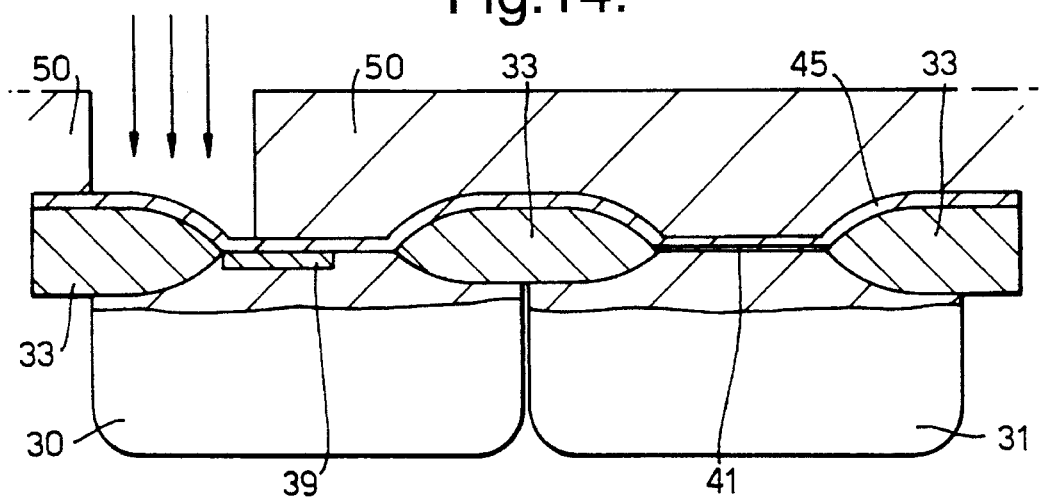
Figure 15:
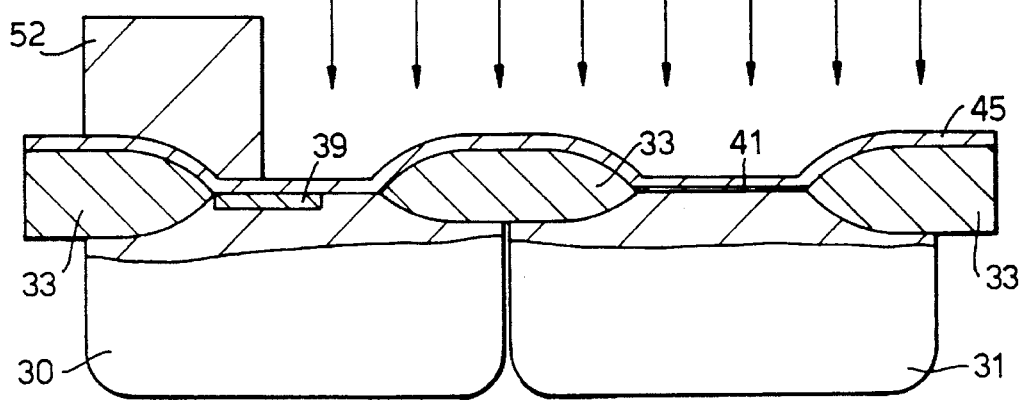
Figure 16:
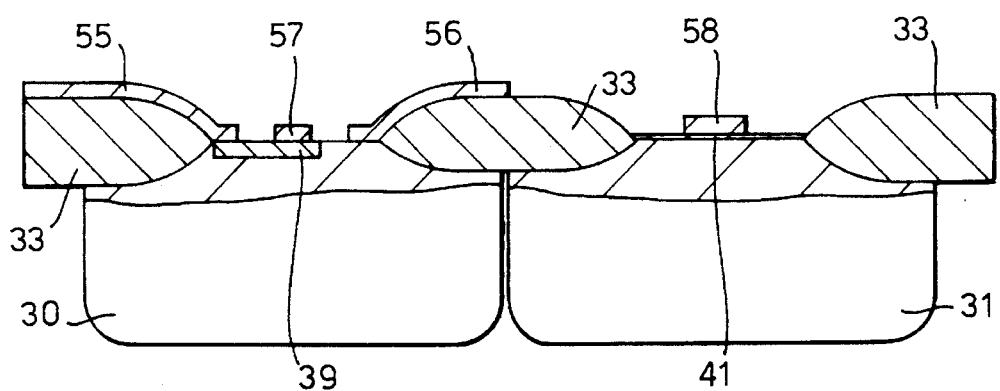

In FIG. 14 a mask of resist 50 has been printed to define the area of the polysilicon base electrode (see FIG. 1), which is then implanted with $P^+$ dopant as shown by the arrows. Resist 50 is then removed and the reverse process is carried out as shown in FIG. 15, using a further resist mask 52, to implant $N^+$ dopant into the remainder of the polysilicon layer 45.

A printing and etching process is then carried out to define the areas of the $P^+$ base electrode 55, the $N^+$ collector electrode 56, the $N^+$ emitter electrode 57 (the emitter region is not yet formed) and the $N^+$ electrode 58 of the CMOS device.

Figure 17:
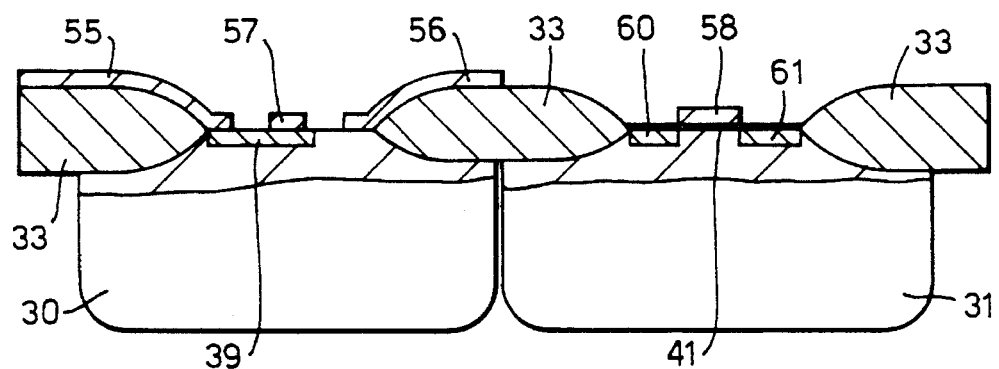
Figure 18:
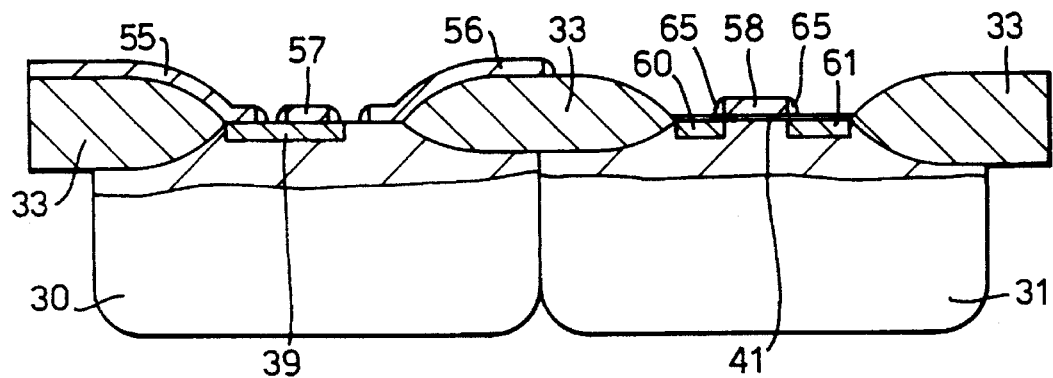

Next, the lightly doped drain (LDD) regions of the CMOS device are formed by further steps of mask printing, $N^-$ implantation (Phosphorous, 70 kv $2\times10^{13}$) and mask removal to define the LDD $N^-$ regions 60,51 shown in FIG. 17. These are conventional CMOS process steps.

Next, oxide is deposited to a thickness of 2500 A (250 nm) and selectively etched to provide oxide spacers 65 at the edges of all of the polysilicon electrodes 55,56,57, 58. Only some of the spacers 65 are indicated, for the sake of clarity.

Figure 19:
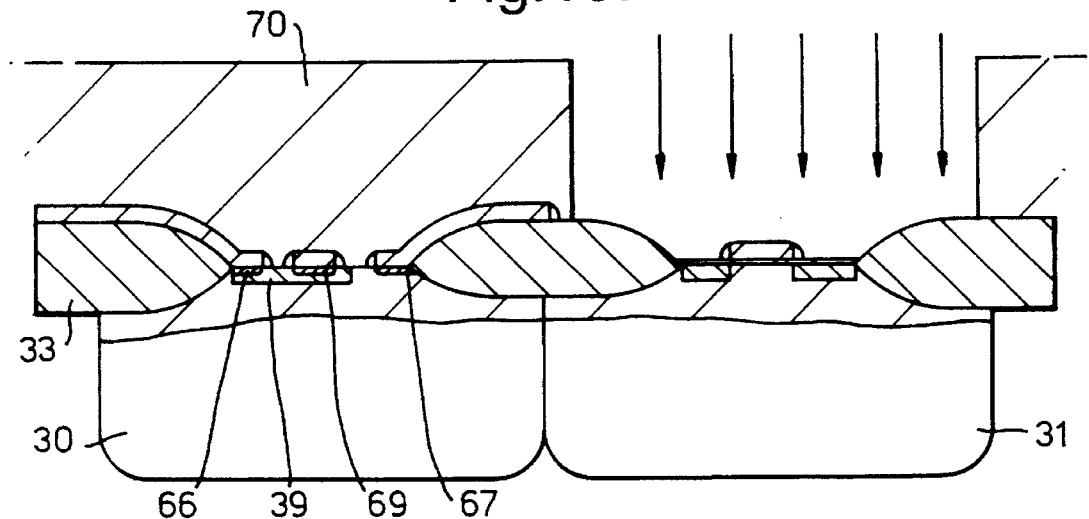

A polysilicon reoxidation process is next carried out in order to drive dopant out of the polysilicon electrodes in the bipolar region into the underlying substrate. The effect of this is to form an $N^+$ emitter region 69 in the P base region 39, as shown in FIG. 19 and regions 66,67, equivalent to regions 5 and 8 of FIG. 1. The reoxidation is carried out at 950° C. and includes growth of an oxide layer 325 A (32.5 nm) thick.

The formation of the bipolar transistor on the bipolar N-Well 30 is now complete, save for the addition of metal contacts. Some further steps are carried out to complete the CMOS device on the right side of the diagrams, as follows.

The bipolar region is masked with resist 70 as shown in FIG. 19 and then implanted with As, at 120 keV and a concentration of $5\times10^{15}$, i.e. $N^+$ implantation.

Figure 20:
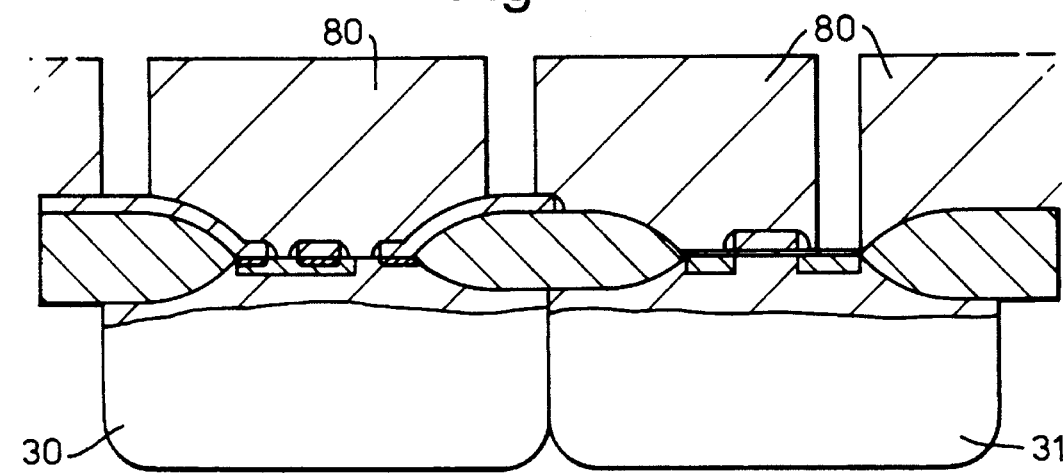
Figure 21:
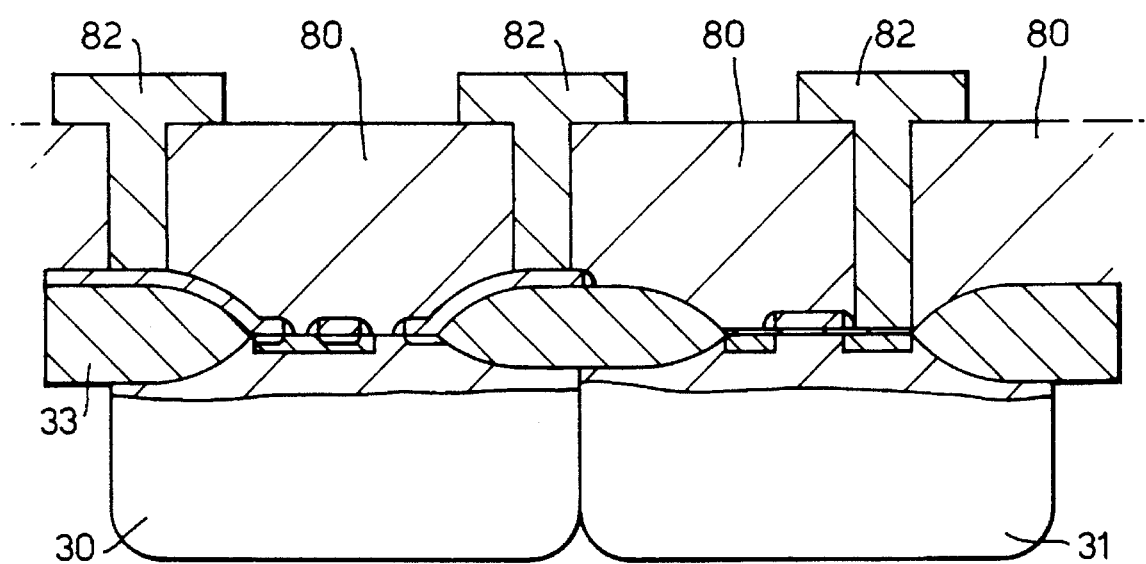

The device based on the CMOS P-Well then undergoes various standard process steps to define the CMOS device which do not form part of the invention.. Eventually, the whole device is ready for a contact printing step, comprising deposition of contact material and selective etching to leave contacts on the polysilicon electrodes, 55,56,57 (see FIG. 2). As shown in FIG. 20, all but the contact areas are provided with an LTO (low temperature oxide) layer 80 through which metal contacts 82 as shown in FIG. 21 are provided to the electrodes 55,56,57, (not visible in FIG. 21) and the $N^+$ region 60 of the PMOS device. The metal contacts 82 are formed by the usual steps of deposition, mask printing, etching and resist removal, followed by a final annealing step.

Figure 22:
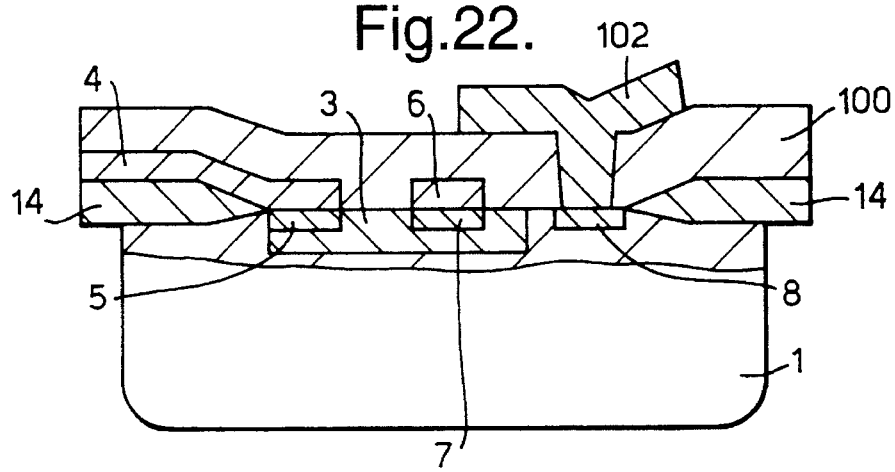
FIG. 22 is a cross-sectional view of a first alternative bipolar transistor according to the invention.
Figure 23:
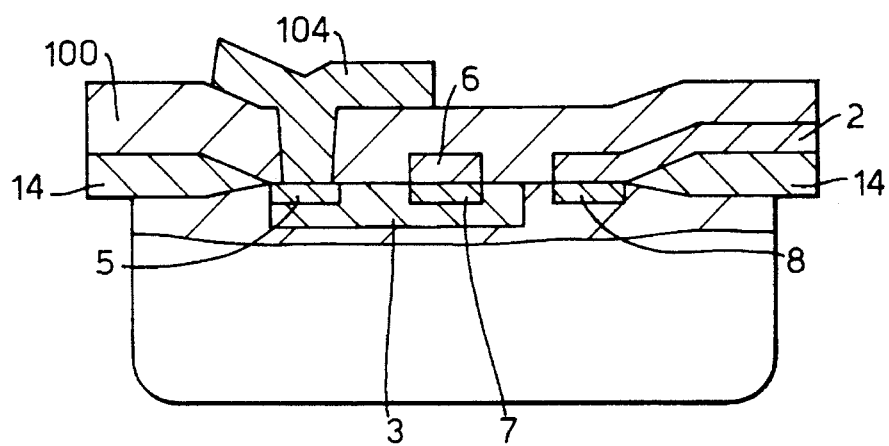
FIG. 23 is a cross-sectional view of a second alternative bipolar transistor according to the invention.
Figure 24:
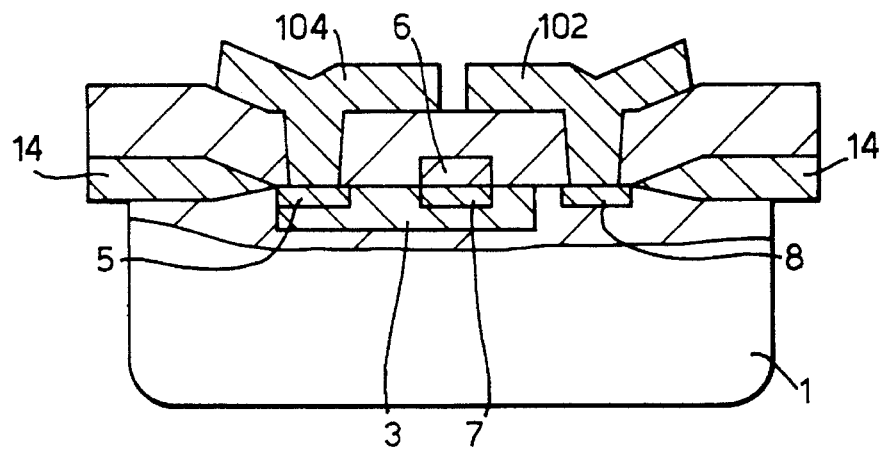
FIG. 24 is a cress-sectional view of a third alternative bipolar transistor according to the invention.

FIGS. 22 to 24 show three variations of the transistor of FIG. 1, which are within the scope of this invention. Like items in these figures and FIG. 1 are indicated with like reference numerals. FIGS. 22 to 24 show an oxide layer 100 formed over the polysilicon electrodes, similar to the oxide layer 80 of FIG. 21.

The common feature of FIGS. 22 to 24 is that instead of including three polysilicon contacts, they each have one or more metal contacts overlapping or adjacent to the polysilicon emitter contact 6 producing an extremely compact structure. The oxide 100 isolates the polysilicon electrodes from the metal contacts. In the embodiment of FIG. 22, the collector electrode is replaced by a metal contact 102. In the embodiment of FIG. 23 the base electrode is replaced by a metal contact 104 and in the embodiment of FIG. 24 both collector and base electrodes have been replaced by metal contacts 102,104. The formation of the metal contacts can be achieved by the industry standard contact and metallisation procedures as used in the majority of CMOS processes.

In all of the four embodiments outlined the bipolar transistor can use the same set of design rules provided for the CMOS device structures. In particular, standard rules that relate to the minimum spacing of structures can be adopted. The electrical characteristics of the MOS transistors are retained.

In all of the embodiments of the invention, the conductivity types of the materials can be reversed so that p-type becomes n-type and vice versa.

I claim:

1. An integrated metal oxide semiconductor device and bipolar transistor formed on a substrate of first conductivity type material comprising:

a well of second conductivity type material formed in said first conductivity type substrate and foxing the transistor collector;

a thin layer of first conductivity type material formed in the surface of a selected area of said collector and forming the transistor base;

a thinner layer of second conductivity type material formed in the surface of a selected area of said base and forming the transistor emitter; and at least one of the collector, emitter and base having an electrode made of a semiconductor material in contact therewith and extending beyond the associated collector, emitter or base in the plane of the substrate; and at least one metal oxide semiconductor (MOS) device formed in an adjacent well of second conductivity type material, the adjacent well having the same depth and dopant atom concentration as the collector well of the bipolar transistor; and wherein the well forming said collector has a dopant atom concentration which is substantially uniform from its surface to at least 50% of its depth and then decreases with increasing depth, and there are no additional layers separating the collector well from the substrate.

2. A transistor as claimed in claim 1 in which the collector well has a depth in the range 2–5 μm.

3. A transistor as claimed in claim 2 in which the collector well has a depth greeter than 3.5 μm.

4. A transistor as claimed in claim 1 in which the concentration of second conductivity type dopant atoms in the surface of the collector is in the range $3 \times 10^{16} - 1.5 \times 10^{17}$ cm$^3$.

5. A transistor as claimed in claim 1 in which the emitter is directly contacted by an electrode.

6. A transistor as claimed in claim 1 in which the collector is directly contacted by an electrode (20).

7. A transistor as claimed in claim 1 in which the base is directly contacted by an electrode.

8. A transistor as claimed in claim 1 in which each electrode is formed of polysilicon material.

9. A transistor as claimed in claim 1 in which each electrode is formed of a silicide material.

* * * * *